US006353265B1

(12) United States Patent
Michii

(10) Patent No.: US 6,353,265 B1
(45) Date of Patent: Mar. 5, 2002

(54) SEMICONDUCTOR DEVICE

(75) Inventor: Kazunari Michii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/877,038

(22) Filed: Jun. 11, 2001

(30) Foreign Application Priority Data

Feb. 6, 2001 (JP) ........................................ 2001-029342

(51) Int. Cl.⁷ ................................................ H01L 23/48
(52) U.S. Cl. ........................................ 257/777; 257/666
(58) Field of Search ................................ 257/666, 686, 257/690, 723, 777, 779, 784, 787

(56) References Cited

U.S. PATENT DOCUMENTS 6,087,722 A * 7/2000 Lee et al. .................... 257/723
6,118,184 A * 9/2000 Ishio et al. .................. 257/787
6,265,760 B1 * 7/2001 Inaba et al. ................. 257/666

FOREIGN PATENT DOCUMENTS

| JP | 4-302164 | 10/1992 |
|----|----------|---------|
| JP | 10-256469 | 9/1998 |
| JP | 2000-156464 | 6/2000 |

* cited by examiner

Primary Examiner—David Nelms
Assistant Examiner—Bau T Le
(74) Attorney, Agent, or Firm—Leydig, Voit, & Mayer, Ltd

(57) ABSTRACT

In a semiconductor device, a stacked semiconductor chip includes semiconductor chips having a principal surface on which pads are arranged and a back surface, an upper semiconductor chip being bonded to the principal surface of a lower semiconductor chip and shifted like stairs and not covering pads. A back surface of the stacked semiconductor chip is fixed to one surface of a die pad of a lead frame where a sunken die pad sink is located. The pads on the stacked semiconductor chip and corresponding inner leads are connected via metal wires by backward wire bonding, and major surfaces of the inner leads, the stacked semiconductor chip, the metal wires, the jointing materials, and the die pad are covered with a sealing material with the back surface of the die pad exposed at an outer surface of the sealing resin.

6 Claims, 10 Drawing Sheets

SEMICONDUCTOR DEVICE

BACKGROUND OF THE INVENTION

1. Field of the Invention

The present invention relates to a reduction in a sealing thickness of a semiconductor device constructed by stacking semiconductor chips.

2. Description of the Invention

In the prior art, for a flash memory card such as the compact flash card, etc. used as the storing medium for a camera, a cam corder, etc., the TSOP (Thin Small Outline Package) which allows a relatively large space in the card and having a standard type package thickness dimension of 1.2 mm, at maximum, is employed. Recently, a smaller flash card was developed, reducing the space in the card, so there is the request that the thickness of the package should be reduced to an about half of the standard TSOP. Also, there is a strong request to make the capacity larger. To avoid attaining a larger capacity in a single semiconductor chip, a semiconductor device called an MCP (Multi Chip Package) in which two semiconductor chips are sealed with a sealant was developed.

FIG. 11 is a sectional view of the MCP in the prior art, that is disclosed in Patent Application Publication (KOHYO) Hei 10-506226, for example, and is constructed by sticking two semiconductor chips onto two surfaces of a die pad of a sheet of lead frame to mount such two semiconductor chips thereon.

The semiconductor chip 3 is jointed to the first surface (that is shown on the upper side of the die pad 1 in FIG. 11) of the die pad 1 via the jointing material 2. The semiconductor chip 5 is jointed to the second surface (that is shown on the lower side of the die pad 1 in FIG. 11) of the die pad 1 via the jointing material 4. Thus, in FIG. 11, the stacked semiconductor chip (the semiconductor chip having both active surfaces) is constructed such that the active surface 3a and the active surface 5a put the die pad 1 and the jointing materials 2, 4 between the top surface and the bottom surface respectively.

One ends of the gold wires 6 are connected to pads (not shown) provided to the active surfaces 3a and 5a via the ball bonding 6c. The other ends of the gold wires 6 are connected to one surfaces 7a of the inner leads 7 and the other surfaces 7b of the inner leads 7 to shift the positions of the stitch bonding 6d. The wire bonding method in which the ball bonding 6c is applied to the pads provided on the semiconductor chips 3, 5 and the stitch bonding 6d is applied to the inner leads 7 is normally carried out in the prior art, and is called the forward wire bonding method.

In FIG. 11, the highest portions 6a, 6b of the gold wires 6 are covered with the sealing resin 8 by the dimension E to seal and protect. The sum E+A+B+A+E of the height dimension A of the highest portions 6b of the gold wires extended upward from the active surface 3a shown in FIG. 11, the thickness B of the stacked semiconductor chip (sum of the semiconductor chips 3, 5, the jointing materials 2, 4 and the die pad 1), the height dimension A of the highest portions 6b of the gold wires extended downward from the active surface 5a, and the dimension E to cover the highest portions of the gold wires 6 gives the total thickness dimension of the MCP.

In the semiconductor device described above in the prior art, there is the drawback that, since the thickness B of the stacked semiconductor chip is given by the sum of the semiconductor chips 3, 5, the jointing materials 2, 4 and the die pad 1, the thickness of the die pad 1 increases the thickness of the both-surface semiconductor chip.

Also, in the forward wire bonding method, there is the drawback that, since the sum D=A+C of the dimension A between the position of the ball bonding 6c and the highest portions 6a or 6b of the gold wires and the dimension C from the position of the ball bonding 6c to the highest portions 6a of the gold wires gives the height dimension from the stitch bonding position to the highest portions of the gold wires, such dimension A overlaps with the above height dimension and thus the gold wires are extended longer by such dimension.

In addition, if the forward wire bonding is applied to the center-pad-arrangement semiconductor chip in which the pads are arranged in the center of the active surface of the semiconductor chip, there is the drawback that, since the gold wires come into contact with the outer periphery of the stacked semiconductor chip, it is impossible to apply the wire bonding to such semiconductor chip.

If the thickness of the semiconductor device must be reduced to 0.5 mm by the structure in the prior art, there is the problem that, unless the thickness of the stacked semiconductor chip can be reduced to less than 0.025 mm with regard to the thickness of two sheets of the jointing material 2×0.025 mm, the metal wire loop height A=0.15 mm to 0.18 mm, and the lead frame plate thickness 0.125 mm, the metal wires 6 are exposed from the outer surface of the sealing resin 8.

If the thickness of the semiconductor chip is reduced to less than 0.1 mm, various problems to be newly overcome have arisen, e.g., the problem that the polishing of the wafer becomes difficult, the problem that the failure occurs when the wafer is carried after the polishing, the problem that the failure occurs when the wafer is divided into individual chips, the problem that the failure occurs when divided semiconductor chips are assembled, etc. Thus, there is the problem that the mass production equipment in the prior art cannot deal with such problems.

Furthermore, if the thickness of the semiconductor device is thin such as 0.5 mm, the height of the external leads is lowered such as 0.25 mm, which is an almost half of the thickness 0.5 mm of the semiconductor device, when the external leads 7 whose plate thickness is 0.125 mm are extracted from the central side surfaces of the semiconductor device, as set forth in Patent Application Publication (KOHYO) Hei 10-506226. Therefore, there is caused the problem that, since it is impossible to sufficiently absorb the thermal strain that is caused by the change in the ambient temperature after the semiconductor device is packaged onto the packaging substrate, there liability margin of the solder jointed portion is reduced.

SUMMARY OF THE INVENTION

Therefore, the present invention intends to provide a semiconductor device having a thickness that is a half of the normalized thickness of the semiconductor device in the prior art, by overcoming the above-mentioned drawbacks in the prior art.

It is an object of the present invention to provide a semiconductor device that is able to shorten a useless and redundant routing of metal wires and reduce a sealing thickness, by constructing stacked semiconductor chips, that are stacked like a stairs, and a loop height of the metal wire not to increase a thickness of the semiconductor device.

To achieve the above object, according to the invention, there is provided a semiconductor device in which a stacked semiconductor chip formed of semiconductor chips that have a principal surface on peripheries of which the pads are arranged and a back surface which opposes to the principal surface respectively, by fixing the back surface of the other semiconductor chip positioned on the upper side onto the principal surface of one semiconductor chip positioned on the lower side by a jointing material not to cover pads like a stairs, and a lead frame is employed in which inner leads and outer leads are continuously formed and in which a die pad, from which die pad suspending leads having a die pad sink are continuously formed, is formed. The back surface of the stacked semiconductor chip is fixed to one surface of the die pad by the jointing material. The pads on the stacked semiconductor chip and corresponding inner leads are connected via the metal wires by a backward wire bonding, and then five major surfaces of the inner leads, the stacked semiconductor chip, the metal wires, the jointing materials, and the die pad are covered with the sealing material to expose the back surface of the die pad from an outer surface of the sealing resin.

Also, according to the invention, the stacked semiconductor chip is formed by stacking the upper semiconductor chip after the upper semiconductor chip is turned by 180 degree in a same plane and is shifted like a stairs, and then fixing it not to cover the pads provided on the lower semiconductor chip.

In addition, the stacked semiconductor chip is formed of two different semiconductor chips such that the pads provided on the principal surface of the lower semiconductor chip are exposed from an outer peripheral area of the upper semiconductor chip.

Further, the back surface of the stacked semiconductor chip is fixed to a thinned portion of the die pad by the jointing material.

Furthermore, top end portions of the inner leads to which a level difference is provided and the corresponding pads provided on the level difference portions of the stacked semiconductor chip are connected by the backward wire bonding.

One ends of the metal wires are connected to one surfaces of the inner leads, that are positioned within a stacked thickness range of the stacked semiconductor chip, by a ball bonding, and other ends of the metal wires are connected to the pads, that are provided to the principal surface of the upper semiconductor chip of the stacked semiconductor chip, by a stitch bonding.

DETAILED DESCRIPTION OF THE PREFERRED EMBODIMENTS

Embodiments will be explained with reference to the accompanying drawings hereinafter. In this case, in respective drawings for illustrating the embodiments of the present invention, their redundant explanation will be omitted by affixing same symbols to elements having the same functions.

Embodiment 1

The embodiment 1 will be explained with reference to a semiconductor device constructed to have a sealing thickness which is a substantial half of the TSOP (Thin Small Outline Package) semiconductor device in which two same semiconductor chips are sealed with a sealing resin to get the sealing thickness of 1 mm and to extract outer leads in two directions.

Figure 1:
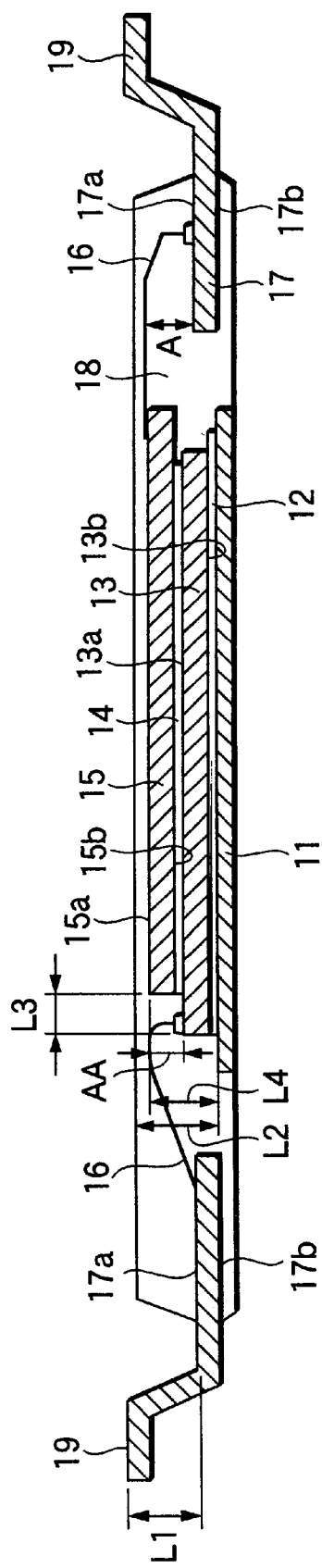
FIG. 1 is a sectional view of a semiconductor device as an embodiment 1.
Figure 2:
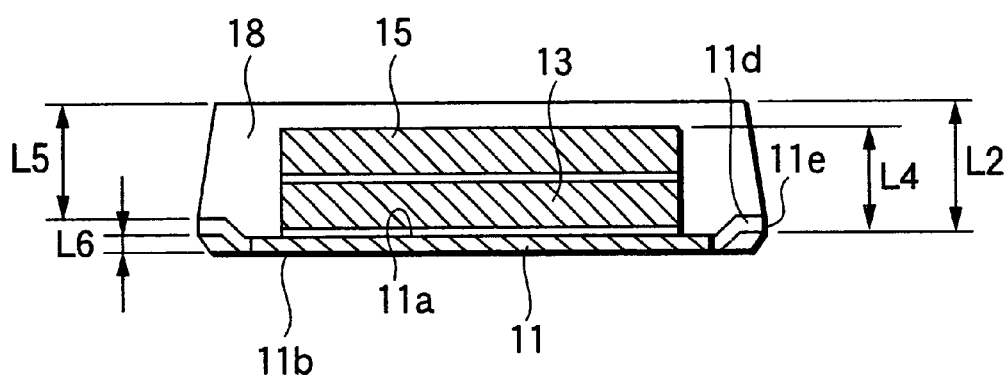
FIG. 2 is a sectional view, that orthogonally intersects with FIG. 1, of the semiconductor device as the embodiment 1.
Figure 3:
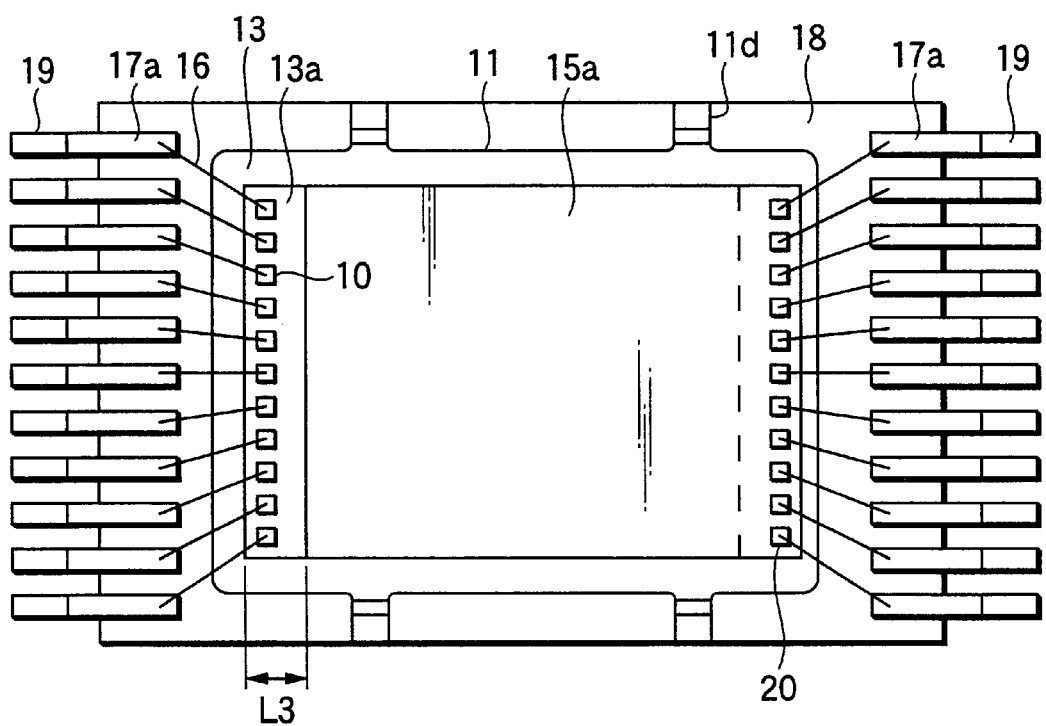
FIG. 3 is a plan view showing the semiconductor device as the embodiment 1 while omitting the sealing resin.
Figure 4:
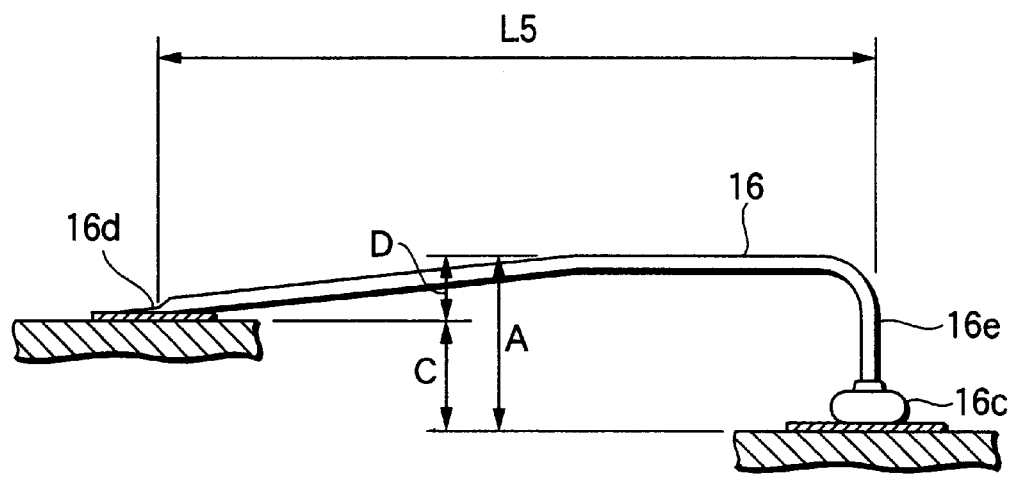
FIG. 4 is a side view of a metal wire.

FIG. 1 is a sectional view of a semiconductor device as an embodiment 1. FIG. 2 is a sectional view, that orthogonally intersects with FIG. 1, of the semiconductor device as the embodiment 1. FIG. 3 is a plan view showing the semiconductor device as the embodiment 1 while omitting the sealing resin. FIG.4 is a side view of a metal wire.

A back surface 13b of a first semiconductor chip 13 shown in FIG. 1 is fixed to a first surface 11a of a die pad 11 via a jointing material 12. A back surface 15b of a second semiconductor chip 15 is fixed by a jointing material 14 to be stacked on an active surface (principal surface) 13a of the first semiconductor chip 13 like a stairs, so that a stacked semiconductor chip is constructed. When the second semiconductor chip 15 is stacked on the first semiconductor chip 13, as shown in FIG. 3, such second semiconductor chip 15 is fixed while shifting like the stairs by L3 such that pads 10 provided onto the principal surface 13a of the first semiconductor chip 13 do not overlap with the second semiconductor chip 15. In FIG. 3, two semiconductor chips 13, 15, which have the same size and the same functions mutually and in which the pads are arranged along one side of the outer periphery, are stacked in the same direction, and then the second semiconductor chip 15 is turned in the same plane by 180 degree with respect to the first semiconductor chip 13 and then is shifted in the long side direction by L3.

The pads 10 and 20 provided to the semiconductor chips 13 and 15 shown in FIG. 3 and first surfaces 17a of inner leads 17 are electrically connected correspondingly by metal wires 16 shown in FIG. 4, by applying the ball bonding 16c to one ends of the inner leads 17 and applying the stitch bonding 16d to the other ends of the metal wires 16 by virtue of the forward wire bonding method and the backward wire bonding method.

In the embodiment 1, the metal wire 16 shown in FIG. 4 is connected by the so-called backward wire bonding method, i.e., the ball bonding 16c is applied to the first surface 17a of the inner lead 17 (depicted on the right side in FIG. 1) arranged in the stacked semiconductor chip side surface area indicated by L4 in FIG. 1, then the metal wire 16 is bent substantially orthogonally at the position (loop height A portion) that is risen vertically from the connected point by a straight portion 16e and then extended horizontally by a dimension L5, and then the stitch bonding 16d is applied to a pad 20 (shown in FIG. 3) provided to the principal surface 15a of the second semiconductor chip 15.

In contrast, the metal wire 16 is connected by the so-called forward wire bonding method, i.e., the ball bonding 16c is applied to the pad 10 on the lower semiconductor chip 13 of the stacked semiconductor chip, then the metal wire 16 is bent substantially orthogonally at the position (loop height AA portion) that is risen vertically from the connected point by the rising straight portion 16e and then extended horizontally, and then the stitch bonding 16d is applied to the first surface 17a of the inner lead 17 shown on the left side in FIG. 1.

According to the backward wire bonding method, the dimension D from the principal surface 15a of the second semiconductor chip 15 to the highest portion of the metal wire 16 can be reduced almost up to a diameter of the metal wire. In contrast, according to the forward wire bonding method applied to connect the pad 10 on the first semiconductor chip 13 and the first surface 17a of the inner lead 17, an amount of upward projection from the active surface 15a of the second semiconductor chip 15 can be reduced since such method is carried out in a range of the sum L4 of the thickness of the second semiconductor chip 15 and the jointing material 14.

As shown in FIGS. 1, 2 and 3, all major five surfaces formed of the inner lead 17, the first and second semiconductor chips 13, 15, the metal wire 16, the jointing materials 12, 14, and the die pad 11 (where the first surface 11a of the die pad 11 and four side surfaces in the plate thickness direction except the second surface 11b are called the major five surfaces) are covered with a sealing resin 18 such that the external leads 19 and four die pad suspending leads 11d for supporting the die pad 11 are protruded from sealing boundary side surfaces. At the same time, one surface of the die pad 11 (back surface 11b shown in FIG. 1) is exposed from the outer surface of the sealing resin 18.

After the sealing, the external leads 19 are formed like the gull wing by cutting away their tiebar portions (not shown) formed continuously on the lead frame and their top portions. Then, the die pad suspending leads 11d formed continuously on the lead frame (not shown) are cut off at the boundary portions of the outer peripheral side surfaces of the sealing resin 18 (four locations 11e shown on the boundary portion of the sealing resin 18 in FIG. 2), whereby the semiconductor device according to the embodiment 1 shown in FIG. 1 can be completed.

Next, a manufacturing method will be explained hereunder. The lead frame is prepared in which two opposing sides shown in FIG. 3 are held by a pair of suspending leads 11d respectively, and also the inner leads 17 and the external leads 19 aligned on two opposing outer peripheral sides, that intersect orthogonally with the sides on which the die pad 11 and the die pad suspending leads 11d, with insulating gaps are successively formed.

This lead frame may have the same structure as the lead frame to which the die pad sink (indicated by L6 in FIG. 2) employed in the TSOP semiconductor device is applied. The explanation about the matrix structure provided to the lead frame, carrying through holes and positioning holes provided the lead frame, sealing resin outflow preventing tiebars, etc. will be omitted. First, the back surface 13b of the first semiconductor chip 13 is fixed to the first surface 11a of the die pad 11 by the jointing material 12. Then, the die bonding step is completed by sticking the second semiconductor chip 15 onto the first semiconductor chip 13 by the jointing material 14 while shifting the second semiconductor chip 15 like the stairs by a dimension L3 shown in FIG. 3 such that the pads 10 on the semiconductor chip 13 are not covered with the second semiconductor chip 15 when the chip 15 is stacked on the first semiconductor chip 13. At this point of time, the stacked semiconductor chip can be completed.

Then, top ends of the inner leads 17 and the corresponding pads, as shown in FIG. 4, are electrically connected by the wire bonding method using the gold wires, the copper wires, the metal wires (metal fine wires) 16 employed in the wire bonding in the prior art. In the forward wire bonding and the backward wire bonding, the explanation of the melting/bonding method by supplying the thermal energy and the mechanical energy of the bonding force and the ultrasonic vibration will be omitted herein.

As the stepped supporting jig and the lead holding jig, the jigs utilized in the mass production in the prior art are employed. The stepped supporting jig has a first supporting surface for supporting the second surfaces 17b of the inner leads 17 and a second impressed concave flat surface provided in the first supporting surface to support the die pad 11. The lead holding jig supports the second surfaces 17b of the inner leads 17 and the die pad suspending lead lid and has through holes at the top end portions of the first surfaces 17a of the inner leads 17 to surround areas to which the ball bonding or the stitch bonding is applied.

The second surfaces 17b of the inner leads 17 are placed on the first supporting surfaces of the supporting jigs, then the back surface 11b of the die pad 11 is placed on the second impressed concave flat surface, and then the inner leads 17 and the die pad suspending leads lid are sandwiched and clamped by the supporting jig and the lead holding jig while putting the lead holding jig on the first surfaces 17a of the inner leads 17.

After this, the metal wires 16 are electrically connected by the backward wire bonding method, i.e., as shown in FIG. 1, one ends of the metal wires 16 are connected to the first surfaces 17a of the inner leads 17 by the ball bonding 16c in opening areas of the through holes of the lead holding jig, then the rising straight portions 16e are raised in parallel with the side surface of the stacked semiconductor chip, an then the stitch bonding 16d is applied to the corresponding pads 20.

Then, the metal wires 16 are electrically connected by the forward wire bonding method, i.e., the ball bonding 16c is applied to the pads 10 on the principal surface 13a of the first semiconductor chip 13, then the straight portions 16e are raised (loop height AA) in parallel with the side surface of the second semiconductor chip 15, and then the stitch bonding 16d is applied to the top end portions of the first surfaces 17a of the inner leads 17. Thus, the wire bonding steps can be completed.

Then, the second surfaces 17b of the inner leads 17 and the back surface 11b of the die pad 11 are brought into contact with a lower mold and then an upper mold is placed on the first surfaces 17a of the inner leads 17, then the upper mold and the lower mold are clamped, and then the sealing resin 18 such as the thermosetting resin, etc. that is melted at the high temperature is injected into a cavity provided between the upper mold and the lower mold at the high pressure. Thus, five major surfaces formed of the stacked semiconductor chip, the gold wires 16, and the die pad 11 are sealed, whereby the sealing step can be completed. The sealing resin 18 employed in the embodiment 1 is not particularly specified if such material is developed for the semiconductor device. Also, since the upper mold and the lower mold are employed in the sealing step (molding step) are not changed from those employed in the semiconductor device manufacturing steps in the prior art, their explanation will be omitted.

If the lead frame in which a plurality of die pads are formed like a single column or multi-column matrix is employed, a plurality of semiconductor devices can be formed successively on the lead frame portion (not shown) by top end portions of the outer leads 19 and the die pad suspending lead 11d, and then the plurality of semiconductor devices are divided into individual semiconductor devices in the subsequent stage. In the dividing step, the top end portions of the outer leads 19 are separated from the lead frame by the cutting means such as the laser processing, the machining, etc.

At the stage that the lead shaping step for shaping the top end portions, disconnected by the cutting means, of the outer leans like the gull wing is completed, the die pad suspending leads 11d are formed continuously on the lead frame portion. Therefore, after the necessary assembling steps such as the marking and others, for example, are executed, the plurality of semiconductor devices are perfectly divided into the pieces by cutting away the die pad suspending leads 11d from the lead frame finally at the sectional shape 11e of the die pad suspending lead 11d on the boundary of the sealing resin side surfaces in FIG. 2. Thus, the stacked semiconductor device according to the embodiment 1 shown in FIG. 1 to FIG. 3 can be obtained.

Example 1

The semiconductor device whose thickness is 0.55 mm will be explained with reference to FIG. 5. The lead frame is prepared in which the inner leads 17, the die pad 11, the die pad suspending leads, the tiebars, the frame, the section bar, etc. are constructed similarly to the lead frame employed in the TSOP package and which has a thickness of 0.125 mm.

A flat surface portion 11c of the die pad 11 is formed thinner than the die pad suspending leads 11d and the inner leads 17 by reducing a thickness of 0.125 mm by 0.075 mm such that a thickness of the flat surface portion 11c of the die pad 11 becomes 0.050±0.02 mm. Also, the back surface 11b of the die pad 11 is bent at the die pad suspending lead 11d portion, as shown in FIG. 2, to give a level difference to the back surfaces 17b of the inner leads 17 by L6=0.1 mm (referred to as a "die pad sink" hereinafter).

As the semiconductor chips, two semiconductor memory chips 13, 15, in which the pads 10 are arranged along one side near the outer periphery of the active surface and which have a thickness of 145±10 μm and have the same size and the same function, are prepared. The lower semiconductor memory chip 13 is fixed to the flat surface portion 11c of the die pad 11 by the tape jointing material 12 having a thickness of 25 μm, and then the back surface 15b of the upper semiconductor memory chip 15 (in the case of Example 1, this chip is identical to the semiconductor memory chip 13) is fixed to the active surface 13a of the lower semiconductor memory chip 13 by the jointing material 14 having a thickness of 25 μm.

At this time, the upper semiconductor memory chip 15 is fixed to the lower semiconductor memory chip 13 by turning the upper semiconductor memory chip 15 with respect to the lower semiconductor memory chip 13 by 180 degree and shifting the upper semiconductor memory chip 15 by L3=1.0 mm in the long-side direction like the stairs such that the upper semiconductor memory chip 15 do not cover the pads 10 on the lower semiconductor memory chip 13, whereby the stacked semiconductor chip in which the pads 10 and 20 shown in FIG. 3 are arranged on two opposing left and right sides can be obtained.

Since the pads 20 on the upper semiconductor memory chip 15 are positioned higher than the corresponding first surface 17a of the inner leads 17 by L8=0.170 mm, the gold wires 16 are connected to the pads 20 at the loop height A=0.22 mm by the backward wire bonding. If doing so, the dimension that the highest portions (loop height A) of the gold wires 16 protrudes upward from the active surface 15a of the upper semiconductor memory chip 15 can be set to 0.05 mm.

In contrast, since the lower pads 10 are positioned lower than the upper pads 20 by the sum of the thickness of the upper semiconductor memory chip 15 itself and the thickness of the jointing material 14, i.e., 0.1725±0.012 mm, the metal wires 16 are connected to the pads 10 by the forward wire bonding to get the loop height AA=0.180±0.03 mm.

According to the above structure, a dimension from the upper principal surface of the stacked semiconductor memory chip to the back surface 11b of the die pad 11 becomes 0.395±0.044 mm. The sealing resin injection space (cavity) between the upper mold and the lower mold is set to 0.550 mm such that the thickness of the semiconductor device becomes 0.550±0.025 mm. Then, the sealing resin 18 is injected into the cavity while bringing the back surface 11b of the die pad 11 into contact with the bottom surface of the lower mold to seal the stacked semiconductor memory chip.

Then, after the dividing step and the outer lead forming step are completed, the very thin semiconductor device in which the TSOP stacked semiconductor chips are built can be obtained. In such semiconductor device, as shown in FIG. 5, the thickness dimension from the surface of the sealing resin 18 to the exposed back surface of the die pad 11 is 0.550±0.025 mm, a dimension L7 of the sealing resin 18 from the surface of the outer leads 19 to the exposed surface of the die pad is 0.1 mm, a dimension L6 of the sealing resin 18 from the surface of the sealing resin 18 to the outer leads 19 (upper surfaces of the outer leads 19 in FIG. 5) is 0.325 mm, the outer leads 19 are protruded from the position deviated from the center of the side surfaces of the sealing resin 18 of the semiconductor device by 0.1125 mm, and L1 is larger than 0.325 mm.

In Example 1, a thickness dimension of the sealing resin 18 for covering the upper principal surface of the stacked semiconductor memory chip is 0.15 mm (0.550−0.395=0.150). A dimension from the upper active surface to the back surface 11b of the die pad 11 is 0.395 mm. Even if the production error ±0.044 mm in mass production is taken account, the upper active surface can be covered with the sealing resin 18 by 0.111 mm (0.150−0.044=0.111 mm) at a minimum. Also, the highest portions of the gold wires from the stitch bonding position (the first surface 11a of the die pad 11) by the backward wire bonding can be covered with the sealing resin 18 by 0.1 mm, and they can be covered with the sealing resin 18 by 0.056 mm at a minimum even if the production error ±0.044 mm is taken into consideration. Thus, the sufficient sealing quality can be assured.

Also, the loop height dimension AA in the forward wire bonding is 0.180 mm. The highest portions of the gold wires can be covered with the sealing resin 18 by 0.145 mm, and they can be covered with the sealing resin 18 by 0.056 mm at a minimum even if the production error ±0.044 mm is taken into consideration. Thus, the sufficient sealing quality can be assured.

According to the above explanation, since the die pad 11 is exposed from the outer surface of the package, the dimension L2 from the flat surface portion 11c of the die pad 11 to the uppermost surface of the sealing resin 18 can be set large, and the semiconductor device having the thickness of 0.55 mm can be formed by two semiconductor chips each having the chip thickness of 0.1475±0.010 mm unless the thickness of the semiconductor chips 13, 15 is reduced smaller than 0.100 mm that is difficult to process. If the semiconductor chips each having the chip thickness of 0.147±0.010 mm are employed, the stacked semiconductor device can be mass-produced by the existing equipment without the change in production process conditions and thus the new equipment investment is not needed.

Figure 5:
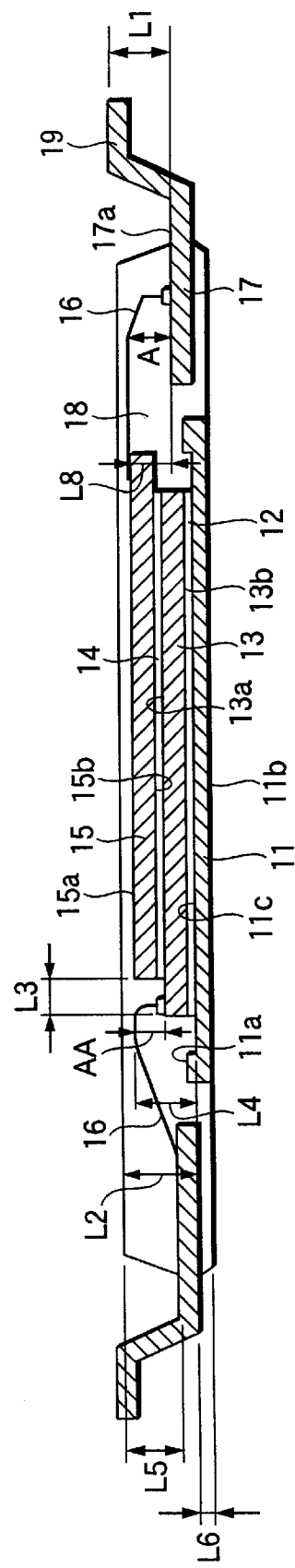
FIG. 5 is a sectional view showing another embodiment of the semiconductor device as the embodiment 1.

Also, since the level difference from the inner lead arrangement surface is provided by L6=0.100 mm by forming the die pad sink, if the sealing by the sealing resin is executed to expose the die pad, the bent suspension leads and the inner leads 17 are covered with the sealing resin and the suspension leads and the outer leads are arranged at the position that is deviated from the center of the side surfaces of the sealing resin by 0.1125 mm (they are offset downward by 0.1125 mm in FIG. 5). When the outer leads 19 are bent in the direction opposite to the exposed back surface 11b of the die pad 11 and then the top ends of the outer leads 19 are shaped like the gull wing, a packaging height L1 of the outer leads 19 can be extended longer by 0.1125 mm rather than the case where the outer leads 19 are protruded from the center of the sides surfaces of the sealing resin 18.

Since the packaging height L1 of the outer leads 19 has an influence of the cube of L1 on the rigidity of the outer leads 19 against the thermal deformation, the rigidity is 3.6 times changed depending upon the presence of the offset. Even if the semiconductor device according to Example 1 undergoes the thermal stress after it is fixed to the packaging substrate by the solder, the packaging reliability can be improved because the thermal strain generated in the solder jointed portions can be absorbed by the deformation of the L1 portions of the outer leads 19.

In addition, it is possible to increase two times the capacity of the semiconductor memory by the stacked semiconductor memory chip in which the same semiconductor memory chips are stacked.

Further, the backward wire bonding method can reduce the height D from the uppermost surface of the stacked semiconductor memory chip to the highest portions of the gold wires and also suppress an amount of the error smaller. Thus, the failure such as the exposure of the gold wires from the surface of the sealing resin 18 can be reduced, and also the thickness dimension of the resin from the active surface of the stacked semiconductor memory chip to the sealing surface can be reduced. As a result, the thickness of the semiconductor chip can be reduced much more.

Example 2

Example 2 in which the thickness 1 mm of the sealing resin in the TSOP in the prior art is applied to the semiconductor device having a thickness of 0.625 mm will be explained with reference to FIG. 1 and FIG. 2 hereunder.

In the stacked semiconductor device in Example 2, the lead frame is employed in which the die pad 11 and the die pad suspending lead lie are continuously formed and the inner leads 17 formed to provide the die pad sink of 0.1 mm, as shown in FIG. 2, and the outer leads 19, both having a plate thickness of 0.125 mm, are continuously formed. Two semiconductor memory chips each having a thickness of 0.147 mm are stacked on the first surface 11a of the die pad 11 shown in FIG. 1 and then fixed by the jointing material of 0.025 mm like the stairs, then the pads on the stacked semiconductor chip and the corresponding inner leads 17 are wire-bonded, and then the resin sealing is applied by using the upper mold and the lower mold that are constructed to have the cavity dimension of 0.625 mm. Thus, the semiconductor device can be obtained in which L4 is 0.345 mm, the resin sealing dimension for covering the principal surface of the stacked semiconductor chip is 0.155 mm, L2 is 0.500 mm, and a total thickness as the sum of L2 and the die pad thickness 0.125 mm is 0.625 mm, as shown in FIG. 1.

The stacked semiconductor device according to the embodiment 1 is explained with reference to Example 1 and Example 2. In this device, the outer leads 17 can be buried in the sealing resin 18 by the die pad sink since the lead frame having the die pad sink is employed, the stacked semiconductor chip is constructed by stacking two same semiconductor memory chips while shifting the principal surface of one chip 13 and the back surface of the other chip 15 like the stairs, the back surface of the stacked semiconductor chip is fixed to one surface of the die pad 11, the metal wires 16 are connected to the upper pads 20 and the lower pads 10 on the stacked semiconductor chip by the backward wire bonding method and the forward wire bonding method respectively, and the sealing is performed to expose the back surface 11b of the die pad 11 from the outer surface of the sealing resin 18. But applications described in the following may be employed.

In the embodiment 1, the stacked semiconductor chip constructed by turning the upper semiconductor chip 15 with respect to the lower semiconductor chip 13 by 180 degree and then shifting the upper semiconductor chip 15 in one side direction like the stairs is explained. In contrast, while employing the semiconductor chip in which the pads are arranged along two orthogonally-intersected outer peripheral sides of the principal surface of the semiconductor chip, the stacked semiconductor chip may be constructed by turning the upper semiconductor chip with respect to the lower semiconductor chip by 180 degree on the same plane and then shifting the upper semiconductor chip in two orthogonally-intersected directions like the stairs not to cover the pads formed on the semiconductor chips respectively. Such stacked semiconductor chip may be applied to the very thin semiconductor device having a thickness that is a half of the thickness 1.4 mm of the TQFP (Thin Quad Flat Package) semiconductor device, in which the outer leads are projected from four outer side surfaces of the sealing resin.

In Example 1, the very thin stacked semiconductor device is explained in which the sealing resin thickness of 0.55 mm can be achieved by employing the lead frame of 0.125 mm thickness having the die pad sink of 0.1 mm depth and also impressing the stacked semiconductor chip mounting surface by 0.075 mm to reduce the thickness of the die pad to 0.05 mm. In contrast, if the lead frame of 0.1 mm thickness is employed and an impressed depth is set to 0.045 mm, the very thin semiconductor device having a thickness of 0.55 mm can be formed completely similarly to Example 1.

In Example 2, the very thin stacked semiconductor device of 0.625 mm thickness is explained in which the die pad surface working that causes the cost to increase is omitted and the lead frame of 0.125 mm thickness that has the level difference of 0.1 mm between the back surface of the die pad and the back surfaces of the inner leads is employed, in the situation that the cost has priority to the request for reducing the thickness of the sealing resin to 0.55 mm when the thickness is less than 1 mm of the TSOP. In contrast, if the lead frame of 0.1 mm thickness is employed, the very thin semiconductor device having a thickness of 0.6 mm can be formed without the change of the molds.

Embodiment 2

A method of constructing the very thin semiconductor device by using the stacked semiconductor chip, in which the upper semiconductor memory chip is shifted simply in parallel with the lower semiconductor memory chip like the stairs and then fixed, when such stacked semiconductor chip is formed by using two same semiconductor memory chips will be explained in this embodiment 2 hereunder.

Figure 6:
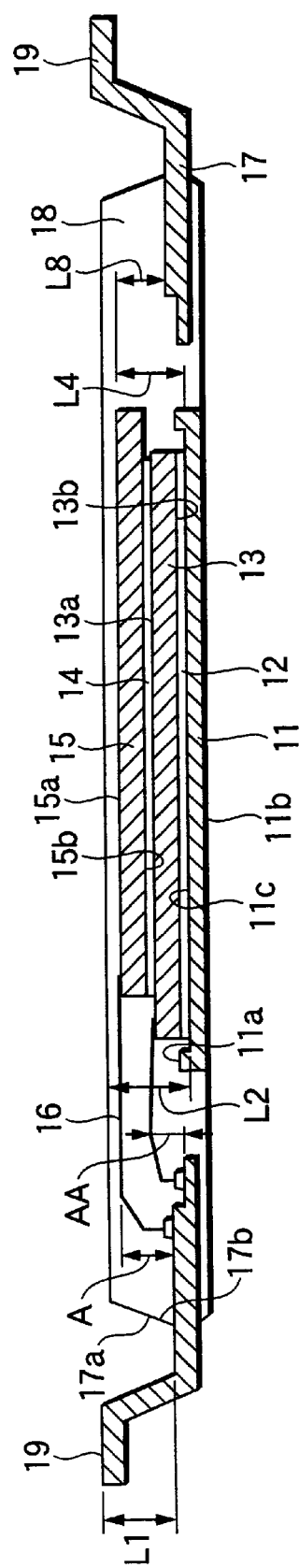
FIG. 6 is a sectional view of a semiconductor device as an embodiment 2.
Figure 7:
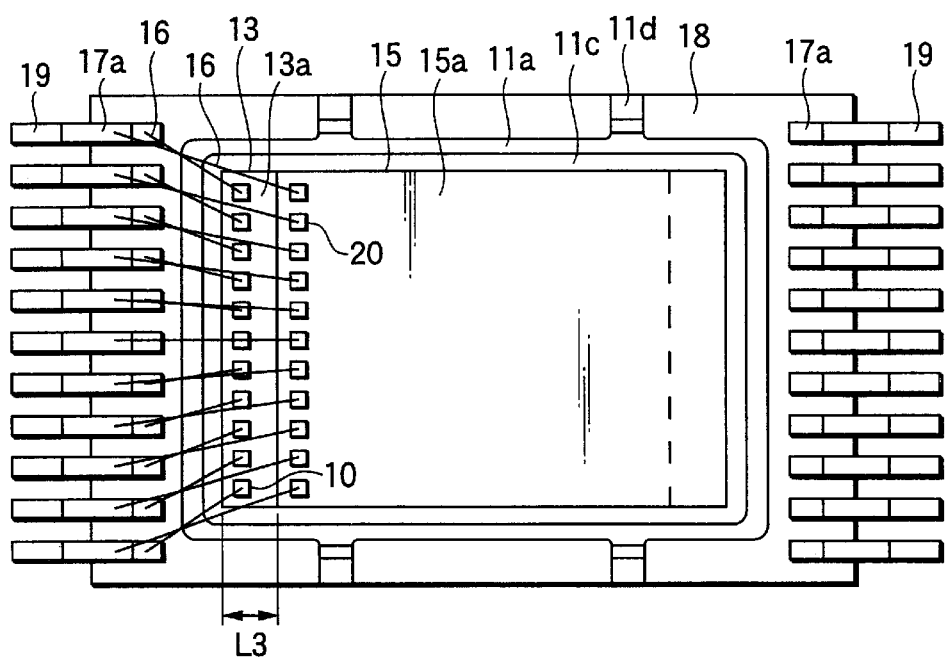
FIG. 7 is a plan view showing the semiconductor device as the embodiment 2 while omitting the sealing resin.
Figure 8:
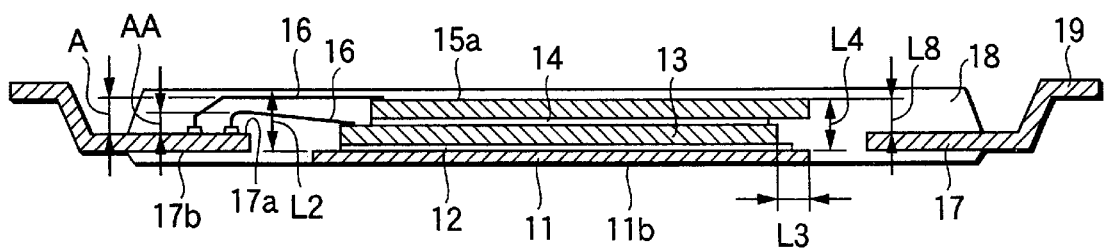
FIG. 8 is a sectional view showing another embodiment of the semiconductor device as the embodiment 2.

FIG. 6 is a sectional view of a semiconductor device as the embodiment 2. FIG. 7 is a plan view showing the semiconductor device as the embodiment 2 while omitting the sealing resin in FIG. 6. FIG. 8 is a sectional view showing another embodiment of the semiconductor device as the embodiment 2. In this case, redundant explanation of the overlapped portions in the same manufacturing processes as those explained in the embodiment 1 will be omitted hereunder.

As shown in FIG. 6, a level difference is formed by etching or press-working the top end portions of the inner leads 17 of the lead frame used on the embodiment 1 to provide thin flat planes 17c to the top end portions of the inner leads 17. The explanation of the same configuration of the lead frame employed in the embodiment 2 as those of the lead frame employed in the embodiment 1 will be omitted herein.

The back surface 13b of the first semiconductor chip 13 shown in FIG. 6 is fixed to the flat surface portion 11c of the die pad 11 via the jointing material 12. The back surface 15b of the second semiconductor chip 15 (which has the same size and the same functions as those of the first semiconductor chip) is fixed to the principal surface 13a of the first semiconductor chip 13 via the jointing material 14 to thus construct the stacked semiconductor chip. At this time, the first and second semiconductor chips 13, 15 are fixed like the stairs by shifting the upper semiconductor chip 15 in parallel with the lower semiconductor chip 13 by L3 from the state that, as shown in FIG. 7, both chips are stacked to position their pads on the same one side (on one side on the left side in FIG. 6), not to cover the pads 10 provided on the first semiconductor chip 13 formed on the lower stage by the second semiconductor chip 15 formed on the upper stage.

Then, the pads 10, 20 provided on the first and second semiconductor chip 13, 15 are connected to the thin flat planes 17c of the inner leads 17 and the first surfaces 17a of the inner leads 17 via the metal wires 16 by the backward wire bonding respectively. The inner leads 17 shown on the left side in FIG. 7 are connected by the ball bonding, and the inner leads 17 shown on the right side in FIG. 7 are dummy leads that are not connected.

The wire bonding is performed twice. In the first wire bonding, the metal wires 16 are connected to the thin flat planes 17c of the inner leads 17 shown as the lower top portions in FIG. 6 by the ball bonding, and also connected to the lower pads 10 at the loop height AA by the stitch bonding. When the backward wire bonding is applied to all the necessary pads 10 on the lower semiconductor chip 13 of the stacked semiconductor chip, the first wire bonding is completed.

Then, in the second wire bonding, the ball bonding is applied to the first surfaces 17a of the inner leads 17. At this time, the ball bonding is applied to positions that are shifted toward the outer side surface of the sealing resin 18 from the positions to which the ball bonding 16c is applied in the first wire bonding. The metal wires 16 are bent substantially orthogally at the loop height A from the bonded points, then extended to the upper pads 20 in parallel, and then connected to the pads 20 by the stitch bonding 16d. When the backward wire bonding is applied to all the necessary upper pads 20, the second wire bonding is completed.

When the wire bonding is completed, the sealing is carried out by covering all major five surfaces formed of the inner leads 17, the first and second semiconductor chips 13, 15, the metal wires 16, the jointing materials 12, 14, and the die pad 11 except the back surface 11b with the sealing resin 18 such that the outer leads 19 are protruded from the side surfaces of the sealing boundary of the sealing resin 18 and the back surface 11b of the die pad 11 is exposed from the outer surface of the sealing resin 18. When the outer leads 19 are shaped after their top end portions are cut away, the very thin semiconductor device according to the embodiment 2 shown in FIG. 7 can be obtained.

In the embodiment 2, one ends of the gold wires 16 that are ball-bonded to the same inner leads 17 while shifting their positions are connected to the lower pads 10 and the upper pads 20 by the stitch bonding. The extended wiring portions of the gold wires 16 intersect with each other in a plan view of FIG. 7. However, if the intersecting portions are viewed from the side, clearances shown in FIG. 6 can be assured. Even if the gold wires 16 come into contact with each other at these intersecting portions, the short-circuit problem does not occur since the gold wires 16 have electrically the same phase and the same polarity mutually in the stacked semiconductor chip in the embodiment 2.

Example 1

An example in which the stacked semiconductor device according to the embodiment 2 is applied to the very thin semiconductor device of 0.55 mm thickness will be explained with reference to FIG. 6 and FIG. 7 in Example 1 hereunder. The lead frame of 0.125 mm thickness, in which the inner leads 17, the die pad 11, the die pad suspending leads lid, the tiebars, the frame, the section bars, and others are constructed similarly to the lead frame employed in the TSOP package, is prepared.

The flat surface portion 11c is formed on the first surface 11a of the die pad 11 shown in FIG. 6 by impressing, i.e., etching the area, to which the lower semiconductor chip 13 is jointed, shown in FIG. 7 by a depth of 0.075±0.025 mm. Two opposing sides (long sides) of the die pad 11 are held to the frame portion (not shown) of the lead frame by a pair of die pad suspending leads lid respectively.

The inner leads 17 and the outer leads 19, they are aligned to have the insulating clearances, are continuously formed on the outer peripheral sides of two opposing sides (short sides), that intersect orthogonally with the sides on which the die pad 11 and the die pad suspending leads 11d are provided, and held by the frame portion (not shown) of the lead frame.

The level difference is provided between the first surface 11a of the die pad 11 and the first surfaces 17a of the inner leads 17 by L7=0.1 mm shown in FIG. 6. This level difference is formed as the die pad sink of 0.1 mm by bending the die pad suspending lead lid portions.

The thin flat planes 17c are formed on the top end portions of the inner leads 17 of the lead frame by removing them by a depth of 0.075 mm.

The lower semiconductor memory chip 13 of 0.1475 mm thickness, in which the pads 10 are arranged near one side of the outer periphery of the active surface, is fixed to the flat surface portion 11c of the die pad 11 constructed to have the plate thickness of 0.05 mm, via the jointing material 12 of 0.025 mm thickness. Then, the back surface 15b of the upper semiconductor chip 15 is stacked and fixed to the active surface 13a of the lower semiconductor memory chip 13 via the jointing material 14 of 0.025 mm thickness. Thus, the pads 10 on the lower semiconductor chip 13 and the pads 20 on the upper semiconductor chip 15 are formed on one outer peripheral side of the stacked semiconductor chip while shifting in parallel by L3 like the stairs.

Since the upper pads 20 of the stacked semiconductor chip are higher than the first surfaces 17a of the inner leads 17 by L4=0.17 mm, the second ball bonding is performed on the first surfaces 17a side of the inner leads 17 at the loop height A=0.22 mm by the backward wire bonding.

In contrast, since the lower pads 10 are higher than the position of the thin flat planes 17c of the inner leads 17 by 0.0725 mm and the loop height dimension A=0.18 mm of the metal wires 16 is higher than the sum 0.1725 mm of the thickness 0.1475 mm of the upper semiconductor memory chip 15 and the thickness 0.025 mm of the jointing material, the first wire bonding is also performed by the backward wire bonding. Therefore, if viewed from the side, the clearance dimensions can be assured by 0.085 mm at the points at which extended portions of the wire-bonded metal wires 16 intersect with each other in a plan view.

In FIG. 6, since the dimension from the upper principal surface 15a of the stacked semiconductor chip to the back surface 11b of the die pad 11 is 0.395 mm, the upper mold and the lower mold are clamped to get the sealing resin injection space (cavity) of 0.550 mm such that the thickness of the semiconductor device becomes 0.550 mm. The back surface 11b of the die pad 11 is brought into contact with the bottom surface of the lower mold and then the sealing resin 18 is injected, whereby the sealing step is completed. Then, when the dividing step and the outer lead forming step are completed, the very thin semiconductor device in which the TSOP two-layered stacked semiconductor chip is built and which has the thickness dimension 0.550 mm from the front surface of the sealing resin 18 to the exposed back surface 11b of the die pad 11 can be obtained.

In Example 1, since the thickness dimension of the sealing resin 18 for covering the upper active surface of the stacked semiconductor chip is 0.155 mm and also the dimension from the active surface of the semiconductor chip to the back surface 11b of the die pad 11 is 0.395 mm, the active surface of the stacked semiconductor chip can be covered at a minimum with the sealing resin of 0.111 mm thickness with regard to the production error ±0.044 mm in mass production. Also, since the dimension from the principal surface 15a to the highest portions of the gold wires 16 is 0.04 mm, the highest portions of the gold wires 16 can be covered with the sealing resin of 0.071 mm thickness at a minimum and thus the sufficient quality can be assured.

Also, since all the gold wires that are connected to the lower semiconductor chip 13 by the backward wire bonding are constructed in a range of the thickness dimension of the stacked semiconductor chip, the ball bonding positions, the stitch bonding positions, and the highest portions of the gold wires can be sufficiently covered with the sealing resin 18.

Example 2

As the stacked semiconductor device according to the embodiment 2, the semiconductor device, that is constructed by using the cheaper lead frame having a thickness of 0.125 mm to have a thickness of 0.625 mm in contrast to the thickness 1.0 mm of the sealing resin of the TSOP in the prior art, will be explained with reference to Example 2 hereunder.

The explanation overlapped with the embodiment 2 will be omitted herein. In the semiconductor device in Example 2, the stepped pads 20, 10 on the stacked semiconductor chip and two corresponding top end portions 17a, 17c of the inner leads 17 are connected at the height positions A=0.22 mm and AA=0.15 mm by the backward wire bonding while shifting the bonding positions, and the principal surface 15a of the upper semiconductor chip 15 is shifted in the thickness direction because the impression working applied to the first surface 11a of the die pad 11 by the depth of 0.075 mm is omitted. In connection with this, the cavity size in the sealing mold is increased by 0.075 mm up to 0.625 mm.

Example 2 will be explained with reference to FIG. 8 hereunder. If two semiconductor memory chips each has a thickness of 0.147 mm are stacked on the die pad 11 of 0.125 mm thickness by the jointing material of 0.025 mm thickness like the stairs, the semiconductor device in which L4 is 0.345 mm, the dimension from the principal surface of the stacked semiconductor chip to the outermost surface of the sealing resin 18 is 0.155 mm, L2 is 0.5 mm, and the total thickness is 0.625 (=0.500+0.125) mm can be obtained.

The clearances between the metal wires 16 shown in FIG. 8 at the intersecting points of the extended portions of the metal wires 16 become 0.04 mm (=0.22−0.15−0.03), and thus the enough gaps can be assured.

Embodiment 3

In an embodiment 3, a semiconductor device, in which a stacked semiconductor chip is formed to have a level difference by stacking two semiconductor chips having different sizes such that an upper small semiconductor chip is fixed to a lower large semiconductor chip by the jointing material not to cover the pads on the lower semiconductor chip and a back surface of this stacked semiconductor chip is fixed to the die pad, will be explained hereunder.

In the embodiment 3, a method of forming a semiconductor device in which the thickness of the sealing resin of the TQFP semiconductor device, in which the thickness of the sealing resin from which the outer leads are protruded from four side surfaces is normalized to 1.4 mm, is decreased substantially to half will be explained.

Figure 9:
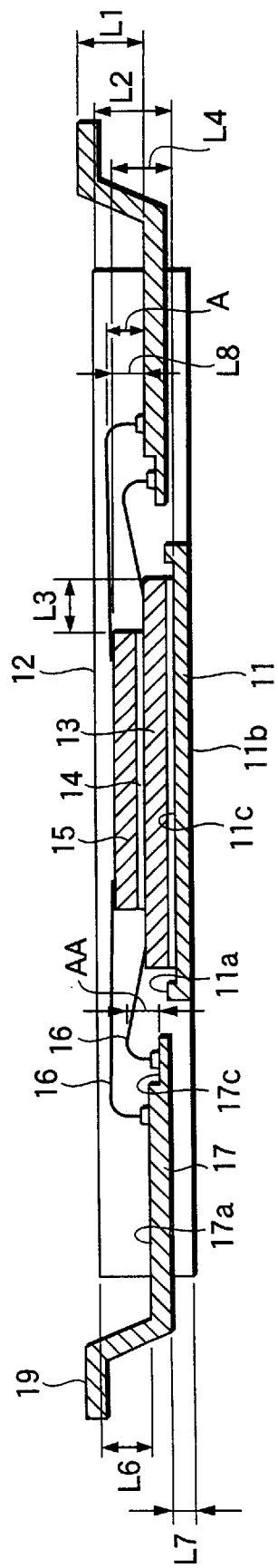
FIG. 9 is a sectional view of a semiconductor device as an embodiment 3.
Figure 10:
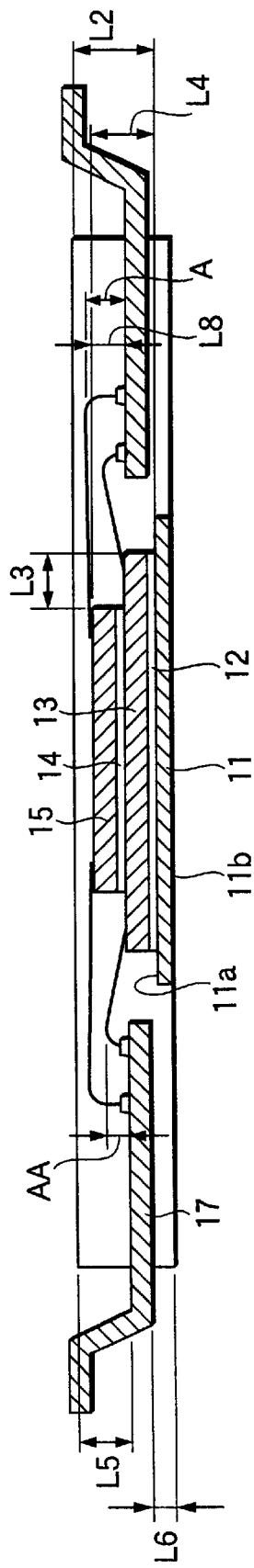
FIG. 10 is a sectional view showing another embodiment of the semiconductor device as the embodiment 3.
Figure 11:
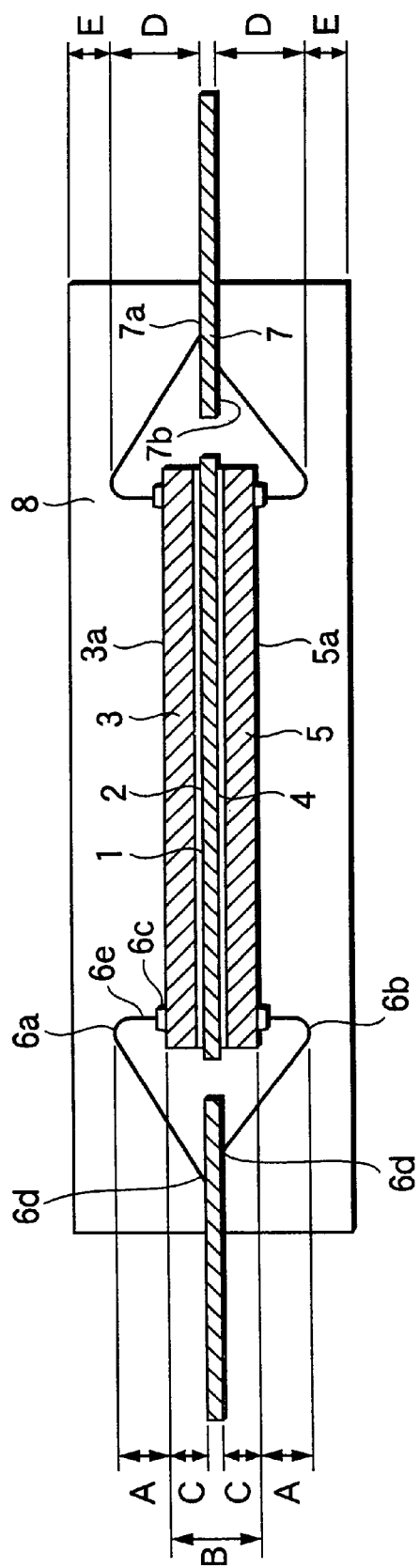
FIG. 11 is a sectional view of a semiconductor device in the prior art.

FIG. 9 is a sectional view of a semiconductor device as an embodiment 3. FIG. 10 is a sectional view showing another embodiment of the semiconductor device as the embodiment 3. In this case, explanation of the redundant portions in the same manufacturing processes will be omitted hereunder.

As shown in FIG. 9, the level difference is formed as the thin flat planes 17c on the top end portions of the inner leads 17 by etching or press-working the top end portions of the inner leads 17 of the lead frame. If the flat surface portion 11c of the die pad 11 onto which the semiconductor chip is fixed can be formed thin, the lead frame employed in the TQFP semiconductor device in the prior art may be used as the first surface 11a of the die pad 11. In this case, the explanation about the tiebars, the frames, the section bars, the stress absorbing slits, the carrying holes, etc. provided to the TQFP lead frame in the prior art is omitted.

As shown in FIG. 9, the back surface 13b of the first semiconductor chip 13 is fixed to the flat surface portion 11c of the die pad 11 by the jointing material 12. The back surface 15b of the second semiconductor chip 15 is fixed to the principal surface 13a of the first semiconductor chip 13 by the jointing material 14, whereby the stacked semiconductor chip is constructed. At this time, as shown in FIG. 8, the first and second semiconductor chips 13, 15 are fixed like the stairs such that the small-size semiconductor chip is stacked as the upper second semiconductor chip 15, as shown in FIG. 8, not to cover the pads 10 provided to the lower first semiconductor chip 13.

Then, the pads 10 provided on the first semiconductor ship 13 and the pads 20 provided on the first semiconductor ship 15 are electrically connected to the thin flat planes 17c of the inner leads 17 and the first surfaces 17a of the inner leads 17 correspondingly and respectively via the metal wires 16 by the backward wire bonding.

The wire bonding is performed twice separately. In the first wire bonding, the thin flat planes 17c of the inner leads 17 formed as the lower top portions are connected to the lower pads 10 of the semiconductor chip 13 of the stacked semiconductor chip via the metal wires 16 at the loop height AA by the backward ball bonding. When the backward wire bonding is applied to all the necessary pads 10 on the lower semiconductor chip 13 of the stacked semiconductor chip, the first wire bonding is completed.

Then, in the second wire bonding, the ball bonding is applied to the first surfaces 17a of the inner leads 17. At this time, the ball bonding is applied to positions that are shifted toward the outer surface of the sealing resin 18 from the positions to which the ball bonding 16c is applied in the first wire bonding. The metal wires 16 are bent substantially orthogonally at the loop height A from the bonded points, then extended to the upper pads 20 in parallel, and then connected to the pads 20 by the stitch bonding 16d. When the backward wire bonding is applied to all the necessary upper pads 20, the second wire bonding is completed.

When the wire bonding is completed, the sealing is carried out by covering all major five surfaces formed of the inner leads 17, the first and second semiconductor chips 13, 15, the metal wires 16, the jointing materials 12, 14, and the die pad 11 except the back surface 11b with the sealing resin 18 such that the outer leads 19 are protruded from the side surfaces of the sealing boundary of the sealing resin 18 and the back surface 11b of the die pad 11 is exposed from the outer surface of the sealing resin 18. When the outer leads 19 are shaped after their top end portions connected to the lead frame are cut away, the semiconductor device shown in FIG. 8 can be obtained.

In the semiconductor device according to the embodiment 3, if the number of the pads provided on the semiconductor chip is different from the number of the inner leads, the case where the metal wires are ball-bonded to two different locations on the top end portion of one inner lead and the case where the metal wires are ball-bonded to one location thereon are mixedly present. These metal wires are stitch-bonded to the corresponding lower pads 10 and the corresponding upper pads 20. Since the stacked semiconductor chip is formed by stacking the semiconductor chips having different sizes and functions like the stairs, the gold wires having the same polarity and the same phase cannot always be intersected with each other. Therefore, the air gaps between the gold wires, as shown in the sectional view of FIG. 8, must be provided three-dimensionally without fail to the intersecting portions of the metal wires Like the embodiment 1 and the embodiment 2, in the semiconductor device according to the embodiment 3, the sum of the thickness L4 of the stacked semiconductor chip, the thickness of the die pad, and the dimension from the uppermost surface of the stacked semiconductor chip to the outer surface of the sealing resin is the thickness of the stacked semiconductor device.

Example 1

In Example 1, an example in which the stacked semiconductor device according to the embodiment 3 is applied to the thickness 0.55 mm of the semiconductor device will be explained, by using the stacked semiconductor chip in which the 10 mm-square periphery-pad arrangement semiconductor chip and the 8 mm-square periphery-pad arrangement semiconductor chip are stacked to coincide center points of respective semiconductor chips.

The lead frame having the plate thickness of 0.125 mm is prepared, and then the thickness of the area of the first surface 11a of the die pad 11 shown in FIG. 9 is reduced to 0.05 mm by etching by 0.075 mm. Four corner portions of the die pad 11 are held to the frame portion of the lead frame by four die pad suspending leads (not shown).

The top end portions of the inner leads 17 are aligned and arrange with the insulating clearances on the outer peripheral side of the die pad 11 to surround the die pad 11. The outer leads 19 and the inner leads 17 are continuously formed and held to the frame portions of the lead frame.

The level difference is provided between the first surface 11a of the die pad 11 and the first surfaces 17a of the inner leads 17 by L7=0.1 mm by bending the die pad suspending lead 11d portions to form the die pad sink.

The thin flat planes 17c are formed on the top end portions of the inner leads 17 of the lead frame by etching the top end portions to remove them by a depth of 0.075 mm from the first surfaces 17a of the inner leads 17.

The lower and upper semiconductor memory chip 13, 15 of 0.1475 mm thickness, in which the pads 10, 20 are arranged near one side of the outer periphery of the principal surface respectively, is fixed to the flat surface portion 11c of the die pad 11 by the jointing material 12 of 0.025 mm thickness. When the principal surface 13a of the lower semiconductor memory chip 13 is fixed to the back surface 15b of the upper semiconductor chip 15 by the jointing material 14 of 0.025 mm thickness to coincide their center points, the stacked semiconductor chip is fixed while shifting the upper semiconductor chip 15 in parallel with the lower semiconductor chip 13 by L3=1 mm like the stairs since difference in one side between the upper semiconductor chip 15 and the lower semiconductor chip 13 is 2 mm.

The upper pads 20 of the stacked semiconductor chip and the first surfaces 17a of the inner leads 17 positioned lower than the pads 20 by L8=0.17 mm are connected at the loop height A=0.22 mm by the second backward wire bonding.

In contrast, since the lower pads 10 are higher than the position of the thin flat planes 17c of the inner leads 17 by 0.0475 mm, the first wire bonding is performed by the backward wire bonding at the loop height dimension AA=0.15 mm. Since the sum of the thickness 0.1475 mm of the upper semiconductor chip 15 and the thickness 0.025 mm of the jointing material is 0.1725 mm, the clearances can be assured between the first and second bonded metal wires 16 by 0.115 mm.

In Example 1, the dimension from the upper active surface (principal surface) of the stacked semiconductor chip to the back surface 11b of the die pad 11 is 0.395±0.044 mm as the sum of L4=0.345±0.024 mm and the thickness of the die pad 11 0.05±0.02 mm. Therefore, if the upper mold and the lower mold are clamped to provide the sealing resin injection space (cavity) of 0.550 mm and the sealing resin 18 is injected while bringing the back surface 11b of the die pad 11 into contact with the bottom surface of the lower mold, the semiconductor device in which the TQFP two-layered stacked semiconductor chip is formed and which has the thickness dimension 0.550 mm from the upper surface of the sealing resin 18 to the exposed back surface 11b of the die pad 11 can be obtained.

In the semiconductor device explained in Example 1 as above, the thickness dimension of the sealing resin 18 for covering the upper principal surface of the stacked semiconductor chip is 0.155 mm (0.550−0.395=0.155). Since the dimension from the active surface of the stacked semiconductor chip to the back surface 11b of the die pad 11 is 0.395 mm, the active surface of the stacked semiconductor chip can be covered at a minimum with the sealing resin of 0.111 mm thickness with regard to the production error ±0.044 mm in mass production. Also, since the dimension from the principal surface 15a to the highest portions of the gold wires 16 is 0.05 mm, the highest portions of the gold wires 16 can be covered with the sealing resin of 0.061 mm thickness at a minimum and thus the sufficient quality can be assured.

Also, since all the ball bonding positions, the stitch bonding positions, and the highest portions of the gold wires for the gold wires, that are connected to the pads on the lower semiconductor chip 13 of the stacked semiconductor chip by the backward wire bonding, are performed in a range of the thickness dimension L4 of the stacked semiconductor chip, such ball bonding positions, such stitch bonding positions, and such highest portions of the gold wires can be sufficiently covered with the sealing resin 18.

Example 2

The stacked semiconductor device, that is formed by using the cheap lead frame to have the thickness is substantially half of the thickness 1.4 mm of the sealing resin of the TQFT in the prior art since the die pad and the top end portions of the inner leads are constructed to have the plate thickness of 0.125 mm, will be explained with reference to Example 2 hereunder. The explanation of the same configuration and the same manufacturing process as the stacked semiconductor chip explained in Example 1 will be omitted.

In Example 2, the back surface 13b of the lower semiconductor chip 13 is fixed to the first surface 11a of the die pad 11 by the jointing material 12. Therefore, the impressing working of 0.075 mm is not needed and the top end portions of the inner leads are not removed by 0.075 mm. For this reason, if the ball bonding in the first backward wire bonding is applied to the first surface 17a of the inner leads 17 at the loop height AA=0.15 mm and the second backward wire bonding is applied at the loop height A=0.22 mm, the gap dimension at the intersecting portions, when viewed from the side, becomes 0.04 mm.

In order to assure the gap dimension by 0.115 mm like Example 1, the loop height in the second backward wire bonding is set to A=0.295 mm. Therefore, the stacked semiconductor device is sealed after the cavity dimension between the sealing molds is increased by 0.15 mm, and thus the stacked semiconductor device which has the thickness of the sealing resin is 0.7 mm can be obtained.

In the stacked semiconductor device in Example 2, the die pad having the plate thickness of 0.7 mm and the inner leads are sealed by using the upper sealing mold and the lower sealing mold in which the cavity dimension is constructed to 0.7 mm, and the semiconductor chips of 0.147 mm thickness are stacked and fixed by two jointing materials of 0.025 mm thickness to the die pad like the stairs. Thus, L4=0.345 mm, the dimension from the principal surface 15a of the stacked semiconductor chip to the outermost surface of the resin sealing is 0.23 mm, L2=0.575 mm, and the total thickness of the stacked semiconductor device is 0.7 (=0.575+0.125) mm.

If the back surface of the stacked semiconductor device is fixed to the die pad in which the die pad sink is provided and then the metal wires are bonded to the upper pads of the stacked semiconductor device by the backward wire bonding method, the semiconductor device in which the die pad is exposed from the outer surface of the sealing resin and the outer leads are buried deeper in the sealing resin by the die pad sink can be obtained when the stacked semiconductor device is sealed with the sealing resin while causing the back surface of the die pad to contact to the lower mold.

Example 2 is explained with reference to the stacked semiconductor chip in which two TQFPs having the sealing resin thickness of 1.4 mm are stacked on the lead frame having the plate thickness of 0.125 mm. However, in the case that there is no limitation to the thickness of the sealing resin and the request for the addition of the functions or the increase of the capacity has priority, the semiconductor device having the thin sealing thickness, which cannot be attained in the prior art, can be obtained if the stacked semiconductor chip is constructed by stacking the semiconductor chips up to three stages or multi-stages.

The present invention is explained by using a sheet of lead frame which is available at a low cost. But the same advantages can be achieved if the die pad portion for supporting the stacked semiconductor chip is constructed separately from the inner lead frame by the die pad frame independently although the cost becomes expensive, or if the lead frame is replaced with the laminated substrate which can be constructed thinner than the lead frame, or if the lead frame is replaced with the tape substrate.

If the pads to which the wirings are needed when the stacked semiconductor chip is constructed are not covered and also the pads on the principal surfaces both have the different levels can be exposed like the stairs, the semiconductor chip is not limited to the semiconductor memory chip. Thus, the similar advantages can be achieved by either the semiconductor chip having any functions or the semiconductor chip having the same size of the different size.

Since the pads on the upper semiconductor chip constituting the stacked semiconductor chip are exposed from the surface of the stacked semiconductor chip, the semiconductor chip is not limited to the periphery-pad arrangement semiconductor memory chip. Thus, the similar advantages can be achieved by either the center-pad arrangement semiconductor chip or the semiconductor chip in which the pads are arranged separately on the principal surface.

If the upper semiconductor chip is shifted like the stairs and fixed to the lower semiconductor chip after such upper semiconductor chip is turned with respect to the lower semiconductor chip by 180 degree in the same plane and then moved in parallel in two orthogonal directions to expose the lower pads informing the stacked semiconductor chip, the similar advantages can be achieved.

If the upper semiconductor chip is shifted like the stairs and fixed to the lower semiconductor chip after such upper semiconductor chip is moved in parallel with the lower semiconductor chip in two orthogonal directions to expose the lower pads on two orthogonal sides in forming the stacked semiconductor chip, the similar advantages can be achieved.

If the upper semiconductor chip whose size is smaller than the lower semiconductor chip on the periphery of which the pads are arranged is shifted like the stairs and fixed to the lower semiconductor chip to expose the lower pads, irrespective of the arrangement of the upper pads, in forming the stacked semiconductor chip, the similar advantages can be achieved even when the center points of the upper and lower semiconductor chips are caused to coincide with each other or not.

The embodiment 1, the embodiment 2, and the embodiment 3 are explained by using the die pad in which the die pad having the die pad sink is larger in size than the semiconductor chip. In this case, the similar advantages can be achieved by the small die pad in which the die pad having the die pad sink is smaller in size than the semiconductor chip or the framed small die pad which has the die pad suspending lead stiffener formed like the frame.

Since the present invention is constructed as described above, advantages given in the following can be achieved.

In the present invention, since one surface of the die pad is exposed from the outer surface of the sealing resin and the die pad sink is formed, the outer leads can protruded to deviate from the center of the side surfaces of the sealing resin. Therefore, there can be achieved the advantages that the thickness of the sealing resin of the semiconductor device can be reduced and the lifetime of the device against the thermal strain after the packaging can be extended longer.

Also, there can be achieved the advantages that, in the TSOP semiconductor device, the thickness of the semiconductor device can be reduced and also the lifetime of the device against the thermal strain after the packaging can be extended longer.

In addition, there can be achieved the advantages that, in the TQFP semiconductor device, the thickness of the semiconductor device can be reduced and also the lifetime of the device against the thermal strain after the packaging can be extended longer.

Further, there can be achieved the advantages that the thickness of the semiconductor device can be reduced much more and also the lifetime of the device against the thermal strain after the packaging can be extended longer.

Moreover, there can be achieved the advantages that the thickness of the semiconductor device can be reduced further more and also the lifetime of the device against the thermal strain after the packaging can be extended longer.

Besides, there can be achieved the advantages that the length of the metal wires can be constructed like the substantial L-shape by the shortest distance and also the thickness of the semiconductor device can be reduced.

What is claimed is:

1. A semiconductor device comprising:
   a stacked semiconductor chip including an upper semiconductor chip and a lower semiconductor chip, both having a principal surface on which pads are arranged and a back surface which opposes the principal surface, the back surface of the upper semiconductor chip being fixed to the principal surface of the lower semiconductor chip with a jointing material, with the upper and lower chips shifted like stairs and not covering any pads;
   inner leads from which outer leads continuously extend;
   a die pad from which die pad suspending leads, to which a sunken die pad is connected, continuously extend; and
   a jointing material, metal wires, and a sealing material, wherein a back surface of the stacked semiconductor chip is fixed to one surface of the die pad by the jointing material, the pads on the stacked semiconductor chip and corresponding inner leads are connected via the metal wires by backward wire bonding, and major surfaces of the inner leads, the stacked semiconductor chip, the metal wires, the jointing materials, and the die pad are covered with the sealing material with a back surface of the die pad exposed at an outer surface of the sealing resin, the outer leads protruding from side surfaces of the sealing resin and exposing cut-off surfaces of the die pad from side surfaces of the sealing resin.

2. The semiconductor device according to claim 1, wherein, in the stacked semiconductor chip, the upper semiconductor chip is turned by 180 degrees and shifted so the stacked semiconductor chip is like stairs, and fixed, not covering the pads on the lower semiconductor chip.

3. The semiconductor device according to claim 1, wherein the upper and lower semiconductor chips have different sizes, respectively, such that the pads on the principal surface of the lower semiconductor chip are exposed at an outer peripheral area of the upper semiconductor chip.

4. The semiconductor device according to claim 1, wherein the back surface of the stacked semiconductor chip is fixed to a portion of the die pad by the jointing material.

5. The semiconductor device according to claim 1, wherein a level difference is provided to top end portions of the inner leads as a thin flat plate portion.

6. The semiconductor device according to claim 1, wherein first ends of the metal wires are connected to first surfaces of the inner leads positioned within a stacked thickness range of the stacked semiconductor chip, by ball bonding, and second ends of the metal wires are connected to the pads on the principal surface of the upper semiconductor chip of the stacked semiconductor chip, by stitch bonding.

* * * * *